United States Patent [19]
Ha et al.

[11] Patent Number: 5,970,309
[45] Date of Patent: Oct. 19, 1999

[54] METHOD OF MANUFACTURING A CAPACITOR AND A CAPACITOR ELECTRODE IN SEMICONDUCTOR DEVICE

[75] Inventors: Jung-min Ha; Byung-lyul Park, both of Seoul; Dae-hong Ko; Sang-in Lee, both of Kyungki-do, all of Rep. of Korea

[73] Assignee: Samsung Electronics Co., Ltd., Rep. of Korea

[21] Appl. No.: 08/950,887

[22] Filed: Oct. 15, 1997

Related U.S. Application Data

[63] Continuation of application No. 08/713,941, Sep. 13, 1996, abandoned.

[30] Foreign Application Priority Data

Sep. 19, 1995 [KR] Rep. of Korea ............ 95-30680

[51] Int. Cl.$^6$ ........................... H01L 21/8242

[52] U.S. Cl. .................. 438/3; 438/253; 438/648

[58] Field of Search .............. 438/3, 238–240, 438/250–256, 381, 393–399, 648–653

[56] References Cited

U.S. PATENT DOCUMENTS

| | | |
|---|---|---|
| 5,037,775 | 8/1991 | Reisman .................... 437/89 |
| 5,079,670 | 1/1992 | Tigelaar et al. ............ 437/47 |
| 5,418,180 | 5/1995 | Brown ...................... 437/60 |
| 5,506,166 | 4/1996 | Sandhu et al. ............. 437/60 |
| 5,585,300 | 12/1996 | Summerfelt ............... 437/60 |

*Primary Examiner*—Jey Tsai
*Attorney, Agent, or Firm*—Myers Bigel Sibley & Sajovec

[57] ABSTRACT

A method of manufacturing a semiconductor capacitor electrode by growing a metal compound layer over polysilicon storage nodes. The metal compound layer readily growing on the polysilicon storage nodes, but not on portions of an insulating layer between adjacent polysilicon storage nodes.

21 Claims, 4 Drawing Sheets

METHOD OF MANUFACTURING A CAPACITOR AND A CAPACITOR ELECTRODE IN SEMICONDUCTOR DEVICE

This application is a continuation of application Ser. No. 08/713,941, filed Sep. 13, 1996 now abandoned.

BACKGROUND OF THE INVENTION

The present invention relates to a method of manufacturing a capacitor in a semiconductor device. More particularly, the present invention relates to a method of manufacturing a capacitor in a semiconductor device using a metal compound having a relatively high melting-point.

With ever increasing integration of semiconductor devices and particularly semiconductor memory devices, both the size of device components and the power supply voltage applied to these components have decreased. More specifically, as integration of semiconductor devices increases, the surface area of capacitor electrodes in the semiconductor devices decreases accordingly. Unfortunately, as the surface area of capacitor electrodes decreases, the overall electrostatic capacity of the capacitor also decreases. Additionally, as power supply voltages decrease with increasing integration of semiconductor devices in order to improve device reliability, the electrostatic capacity of the capacitor further decreases. Thus, conventional capacitor structures and conventional methods of fabricating semiconductor capacitors have proved increasingly unsatisfactory.

In attempts to remedy the foregoing problems, new capacitor structures, such as the cylindrical three-dimensional structure, with increased electrode surface areas having been proposed. Further, dielectric layers formed from materials having higher dielectric constants have been used. For example, the conventional silicon oxide or nitride dielectric layers have been replaced by layers formed from tantalum pentoxide ($Ta_2O_5$) or BST ((Ba, Sr)$TiO_3$)).

FIGS. 1A and 1B are section views illustrating a conventional method of manufacturing a capacitor having a dielectric layer formed from one of these higher dielectric materials. Referring to FIG. 1A, a patterned insulating layer 11 is formed on a semiconductor substrate 10 by deposition of an oxide layer, for example, and selective etching of the insulating layer through a photolithography process to form contact holes exposing predetermined portions of substrate 10. Thereafter, a conductive layer, such as a polysilicon layer doped with phosphorous (P), is used to form a lower electrode 12 of a capacitor. The conductive layer is deposited over the entire surface of the patterned insulating layer 11 filling the contact holes. The conductive layer is then patterned using known photolithography processes to form lower electrode 12 of the capacitor.

Referring to FIG. 1B, a tantalum pentoxide layer or a BST layer is deposited as a capacitor dielectric layer 13 over the surface of the resultant structure following formation of lower electrode 12. Then, a polysilicon layer or a metal layer such as titanium nitride (TiN), tungsten nitride (WN) or tungsten (W) is deposited over dielectric layer 13, thereby forming an upper electrode 14 of the capacitor.

However, this conventional method of manufacturing a semiconductor capacitor is not without its problems. When tantalum pentoxide is used as the capacitor dielectric layer and polysilicon is used to form the upper and lower electrodes, oxygen from the tantalum pentoxide diffuses out and reacts with the polysilicon. This reaction forms an oxide layer at the interface between the dielectric layer and the opposing electrodes. As a result, tantalum (Ta) in the tantalum pentoxide layer assumes a stoichiometrically surplus state with respect to the out-diffused oxygen. This unstable structure tends to increase leakage current in the resulting capacitor.

In order to prevent this problem, efforts have been made to use a metal electrode without the undesired oxidizing properties. However, use of a single thin metal layer as the lower electrode often results in lifting of the thin metal layer during subsequent processing. This is particularly true when attempts are made to use the thin metal layer in complex capacitor structures like the cylindrical three-dimensional structure. Lifting of the thin metal layer results in the development of severe peaks and depressions in the capacitor structure. Such structural anomalies can not be tolerated in highly integrated semiconductor devices.

Thus, to prevent this phenomenon, a method of depositing a metal layer such as TiN, WN, tungsten silicide (WSi) over the structure of a completed lower electrode has been adopted. However, this method requires additional steps to separate and isolate adjacent metal layer over capacitors arranged with increasingly narrow separation intervals. Such additional steps are costly and difficult to perform.

SUMMARY OF THE INVENTION

The present invention provides a method of manufacturing capacitors in a semiconductor device which overcome the problems inherent in conventional methods. To achieve these results, the present invention provides a method of manufacturing a capacitor electrode in a semiconductor device, comprising the steps of; forming a plurality of polysilicon storage nodes having portions of an insulating layer exposed therebetween, forming a metal compound layer having a first portion growing on the plurality of polysilicon nodes and a second portion existing with selective loss forming over the exposed portions of the insulating layer, and selectively removing the second portion of the metal compound layer.

The metal compound layer preferably consists of $WN_x$, where x is a positive integer, but may also comprise a nitride or a carbide of a metal selected from a group consisting of tungsten (W), molybdenum (Mo), titanium (Ti), tantalum (Ta) or zirconium (Zr).

In another aspect, the present invention provides a method of manufacturing a capacitor in a semiconductor device, comprising the steps of, forming a plurality of storage nodes through a plurality of contact holes in an insulating layer formed over a silicon substrate, such that portions of the insulating layer are exposed between adjacent ones of the plurality of storage nodes and each one of the plurality of storage nodes is in contact with the silicon substrate through a corresponding one of the plurality of contact holes, forming a first metal compound layer having a first portion growing on the plurality of storage nodes and a second portion forming over the exposed portions of the insulating layer, selectively removing the second portion of the metal compound layer to electrically separate adjacent ones of the plurality of storage nodes, forming a dielectric layer over the structure resulting from the step of selectively removing the second portion of the metal compound layer, and forming a second metal compound layer over the dielectric layer.

BRIEF DESCRIPTION OF THE DRAWINGS

The advantages of the present invention will become more apparent upon consideration of a preferred embodiment thereof with reference to the attached drawings in which.

DETAILED DESCRIPTION OF THE INVENTION

Figure 1A:
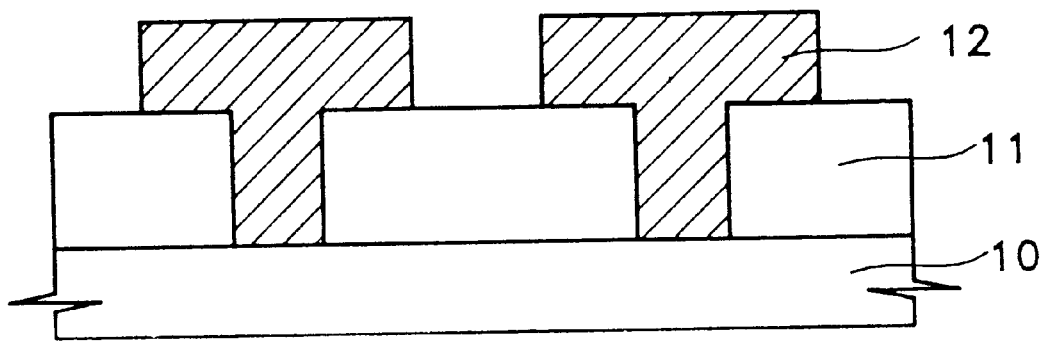
FIGS. 1A and 1B are section views illustrating a conventional method of manufacturing a semiconductor capacitor.
Figure 1B:
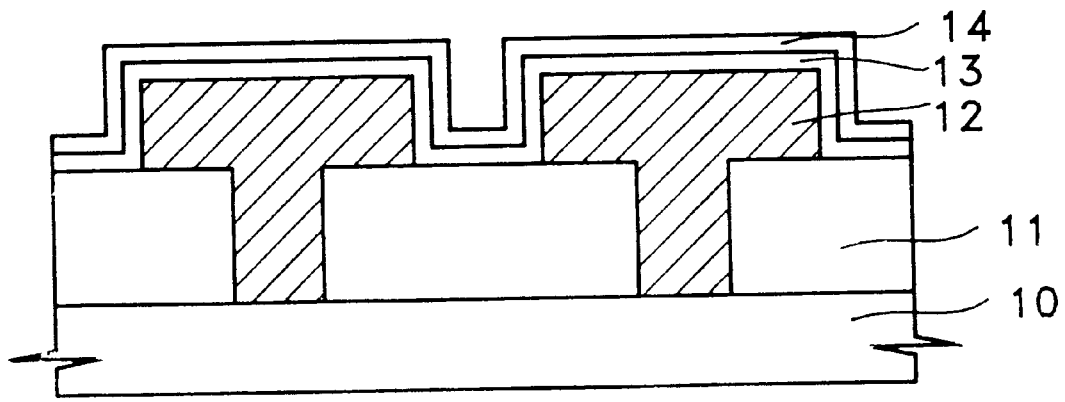
Figure 2A:
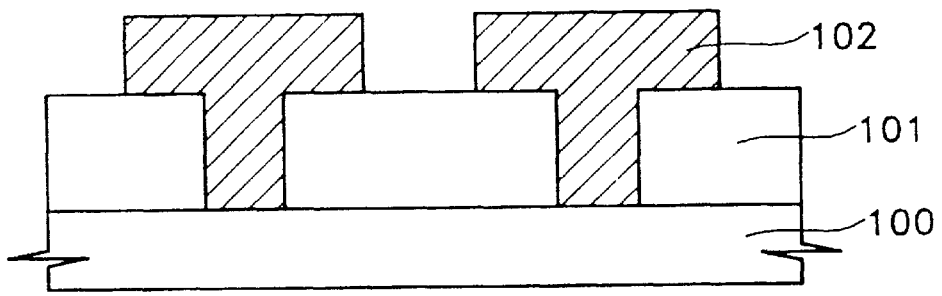
FIGS. 2A to 2C are section views illustrating a method of manufacturing a semiconductor capacitor according to the present invention.
Figure 2B:
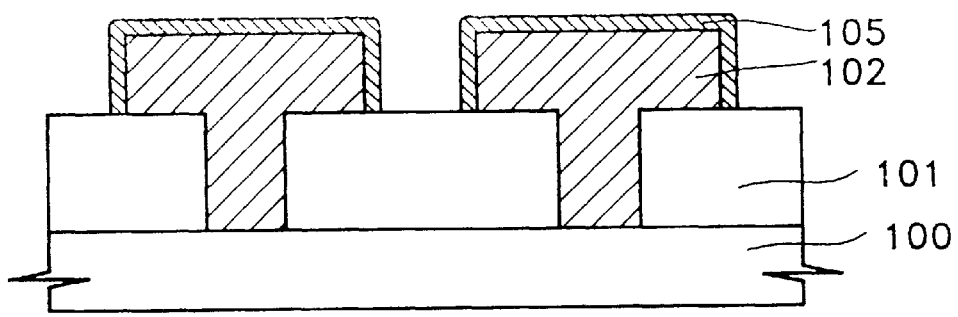
Figure 2C:
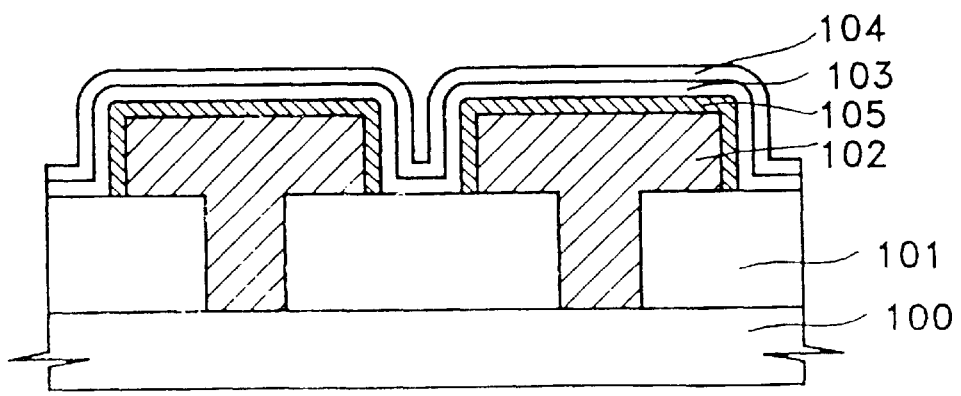

Referring to FIGS. 2A through 2C, a method of manufacturing a semiconductor capacitor having a dielectric layer formed from a high dielectric material according to the present invention will be described.

FIG. 2A shows the step of fabricating a plurality of storage nodes 102. An insulating layer 101 is formed on a semiconductor substrate 100 by depositing insulating material such as silicon dioxide ($SiO_2$) or borophosphosilicate glass (BPSG). Insulating layer 101 is then etched using known photolithography processes to form contact holes exposing predetermined portions of substrate 100. A conductive layer such as a polysilicon layer doped with phosphorous (P) is then deposited over the entire surface of the resultant structure filling the contact holes. The polysilicon layer is then patterned using known photolithography processes to form a plurality of storage nodes 102, each storage node ultimately defining an individual semiconductor capacitor. Here, each storage node in the plurality of storage nodes 102 may assume any structure including stack, cylinder, and fin type structures.

FIG. 2B shows the step of forming a plurality of lower electrodes 105 from the plurality of storage nodes 102. A metal compound having a relatively high melting point, such as a tungsten nitride compound ($WN_x$, wherein x is a positive integer), is selectively formed over each one of the plurality of storage nodes 102, but not formed over portions of insulating layer 101 exposed between adjacent ones of the plurality of storage nodes 102. This metal compound is preferably formed by deposition using a thermal, low-pressure chemical vapor deposition (LPCVD) method. As a result, a plurality of lower electrodes 105 is formed, yet isolated one from another in an easy and cost effective manner.

FIG. 2C shows the step of forming a plurality of semiconductor capacitors. A capacitor dielectric layer 103 formed from one of tantalum pentoxide layer, BST, such as (Ba, Sr)$TiO_3$, or PZT, such as Pb(Zr, Ti)$O_3$, is deposited over the entire surface of the structure resulting from the formation of the plurality of lower electrodes 105. Thereafter, a metal compound having a relatively high melting point, such as TiN, WN, or W, is deposited over dielectric layer 103 to form an upper electrode layer 104.

Figure 3A:
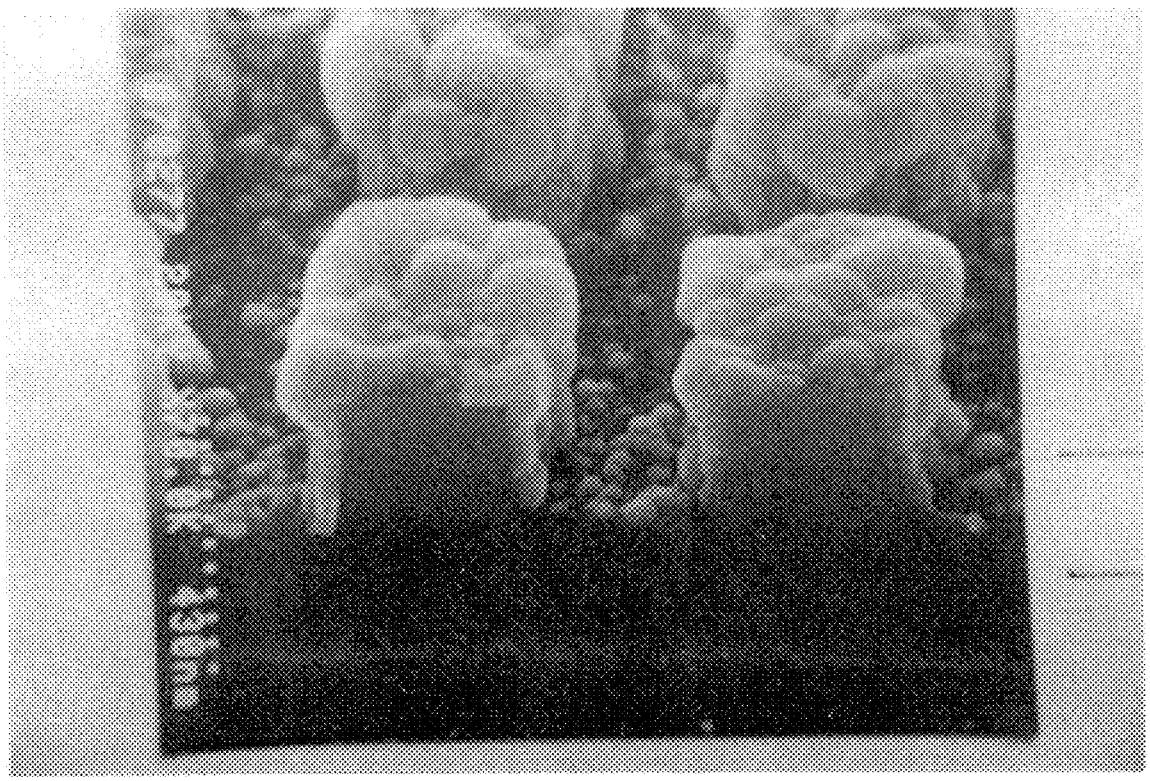
FIG. 3A is a photograph taken using a scanning electron microscopy (SEM), showing a $WN_x$ layer selectively deposited by a thermal low-pressure chemical vapor deposition method; and, FIG. 3B is a schematic section view of the $WN_x$ layer shown in FIG. 3A.
Figure 3B:
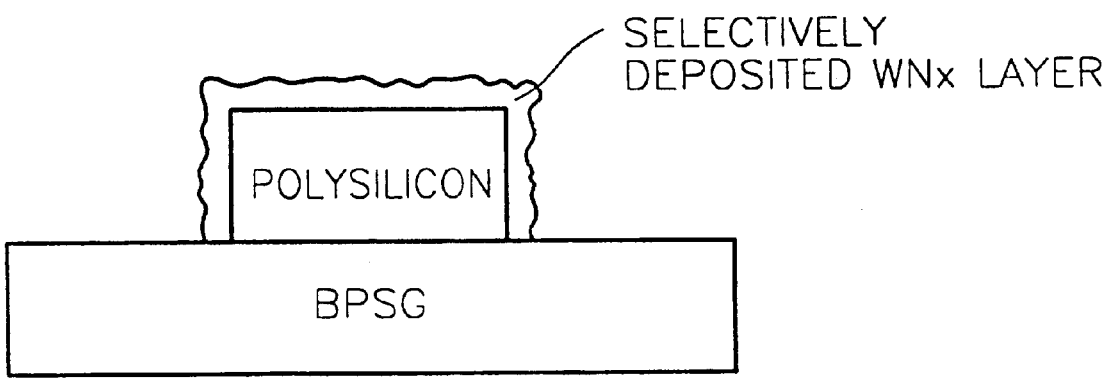

FIG. 3A is a photograph taken using a scanning electron microscopy (SEM), showing the $WN_x$ layer selectively deposited by a thermal LPCVD method and FIG. 3B is a schematic section view of the $WN_x$ layer shown in FIG. 3A. Referring to FIGS. 3A and 3B, the plurality of storage nodes 102 formed of doped polysilicon are formed on the insulating layer comprising BPSG or silicon dioxide ($SiO_2$). The $WN_x$ layer is preferably formed by the thermal LPCVD method under the conditions including a deposition temperature of 600° C. and deposition pressure is 0.1 Torr. The flow rate of $WF_6$ and $NH_3$ are 4 sccm and 20 sccm, respectively. As a result, a first portion of the $WN_x$ layer grows selectively on only the plurality of polysilicon storage nodes. A second portion of the $WN_x$ layer exists in nuclear form with selective loss on the insulating layer made of BPSG. The second portion of the $WN_x$ layer having selective loss can be easily removed using an etch-back process.

As described above, in the method of manufacturing a semiconductor capacitor according to the present invention, the lower capacitor electrode is from a first portion of a metal layer having a relatively high melting point selectively formed over a polysilicon storage nodes while, at the same time, not forming over portions of the insulating layer exposed between adjacent storage nodes. Thus, each lower capacitor electrode is spontaneously formed in such a manner that it is isolated from adjacent lower electrodes without the need for additional photolithography processes.

The present invention has been described with reference to a presently preferred embodiment. The embodiment is given by way of example. Those of ordinary skill in the art will recognize that the particular forms illustrated may be modified without removing such modifications from the scope and spirit of the present invention as defined by the attached claims.

What is claimed is:

1. A method of manufacturing a capacitor electrode in a semiconductor device, comprising the steps of:

forming an insulating layer on a substrate;

forming a plurality of polysilicon storage nodes on said insulating layer such that portions of the insulating layer are exposed between adjacent ones of the plurality of storage nodes;

forming a metal compound layer having a first portion on the plurality of polysilicon nodes and a second portion on the exposed portions of the insulating layer wherein the first portion is formed preferentially with respect to the second portion so that the first portion is thicker than the second portion wherein the metal compound layer comprises a metal compound chosen from the group consisting of a nitride of a metal and a carbide of a metal; and selectively removing the second portion of the metal compound layer.

2. The method of claim 1, wherein the metal compound layer consists essentially of $WN_x$, where x is a positive integer.

3. The method of claim 1, wherein the metal compound layer comprises a nitride of a metal selected from a group consisting of tungsten (W), molybdenum (Mo), titanium (Ti), tantalum (Ta) or zirconium (Zr).

4. The method of claim 1, wherein the metal compound layer comprises a carbide of a metal selected from a group consisting of tungsten (W), molybdenum (Mo), titanium (Ti), tantalum (Ta) and zirconium (Zr).

5. The method of claim 1, wherein the insulating layer comprises BPSG.

6. A method of manufacturing a capacitor in a semiconductor device, comprising the steps of:

forming an insulating layer on a silicon substrate wherein said insulating layer defines a plurality of contact holes therein;

forming a plurality of storage nodes on said insulating layer wherein each of said storage nodes corresponds to a respective one of said contact holes such that portions of the insulating layer are exposed between adjacent ones of the plurality of storage nodes and each one of the plurality of storage nodes is in contact with the silicon substrate through a corresponding one of the plurality of contact holes;

forming a first metal compound layer having a first portion on the plurality of storage nodes and a second portion on the exposed portions of the insulating layer wherein the first portion is formed preferentially with respect to the second portion so that the first portion is thicker than the second portion wherein the metal compound layer comprises a metal compound chosen from the group consisting of a nitride of a metal and a carbide of a metal;

selectively removing the second portion of the metal compound layer to electrically separate adjacent ones of the plurality of storage nodes;

forming a dielectric layer over the first portion of the first metal compound layer and the exposed portions of the insulating layer; and forming a second metal compound layer over the dielectric layer.

7. The method of claim 6, wherein the first metal compound layer comprises a nitride of a metal selected from a group consisting of tungsten (W), molybdenum (Mo), titanium (Ti), tantalum (Ta) and zirconium (Zr).

8. The method of claim 6, wherein the first metal compound layer comprises a carbide of a metal selected from a group consisting of tungsten (W), molybdenum (Mo), titanium (Ti), tantalum (Ta) and zirconium (Zr).

9. The method of claim 6, wherein the dielectric layer comprises one selected from a group consisting of tantalum pentoxide ($Ta_2O_5$), $(Ba, Sr)TiO_3$, and $Pb(Zr, Ti)O_3$, wherein the storage nodes are formed of polysilicon.

10. The method of claim 6, wherein the second metal compound layer comprises a nitride of a metal selected from a group consisting of tungsten (W), molybdenum (Mo), titanium (Ti), tantalum (Ta), and zirconium (Zr).

11. The method of claim 6, wherein the second metal compound layer comprises a carbide of a metal selected from a group consisting of tungsten (W), molybdenum (Mo), titanium (Ti), tantalum (Ta), and zirconium (Zr).

12. A method of manufacturing a capacitor in a semiconductor device, comprising the steps of:

forming an insulating layer on a silicon substrate wherein said insulating layer defines a plurality of contact holes therein;

forming a plurality of polysilicon storage nodes on the insulating layer such that portions of the insulating layer are exposed between adjacent ones of the plurality of storage nodes and each one of the plurality of storage nodes is in contact with the silicon substrate through a corresponding one of the plurality of contact holes;

forming by low pressure chemical vapor deposition a metal nitride compound layer having a first portion on the plurality of storage nodes and a second portion on the exposed portions of the insulating layer wherein the first portion is formed preferentially with respect to the second portion so that the first portion is thicker than the first portion;

selectively removing by etch back the second portion of the metal nitride compound layer to electrically separate adjacent ones of the plurality of storage nodes wherein said step of selectively removing said second portion of the metal compound layer comprises etching back said first and second portions of the metal compound layer so that said second portion is removed and so that some of said first portion remains on said plurality of storage nodes;

forming a dielectric layer over the first portion of the metal nitride compound layer and the exposed portion of the insulating layer; and forming a second metal compound layer over the dielectric layer.

13. The method of claim 12, wherein the metal nitride compound layer comprises a $WN_x$ layer.

14. A method according to claim 6 wherein said step of selectively removing said second portion of the metal compound layer comprises etching back said first and second portions of the metal compound layer so that said second portion is removed and so that some of said first portion remains on said plurality of storage nodes.

15. A method according to claim 1 wherein said step of selectively removing said second portion of the metal compound layer comprises etching back said first and second portions of the metal compound layer so that said second portion is removed and so that some of said first portion remains on said plurality of storage nodes.

16. A method according to claim 2 wherein the step of forming the metal compound layer consisting essentially of $WN_x$ comprises forming the metal compound layer using low pressure chemical vapor deposition at a deposition temperature of 600° C., at a deposition pressure of 0.1 Torr.

17. A method according to claim 2 wherein the step of forming the metal compound layer consisting essentially of $WN_x$ comprises forming the metal compound layer using $WF_6$ at a flow rate of 4 sccm and using $NH_3$ at a flow rate of 20 sccm.

18. A method according to claim 7 wherein the first metal compound layer comprises a nitride of tungsten and wherein the step of forming the metal compound layer comprises forming the metal compound layer using low pressure chemical vapor deposition at a deposition temperature of 600° C., at a deposition pressure of 0.1 Torr.

19. A method according to claim 7 wherein the first metal compound layer comprises a nitride of tungsten and wherein the step of forming the metal compound layer comprises forming the metal compound layer using $WF_6$ at a flow rate of 4 sccm and using $NH_3$ at a flow rate of 20 sccm.

20. A method according to claim 13 wherein the step of forming the metal nitride compound layer comprises forming the metal nitride compound layer using low pressure chemical vapor deposition at a deposition temperature of 600° C., at a deposition pressure of 0.1 Torr.

21. A method according to claim 13 wherein the step of forming the metal nitride compound layer comprises forming the metal nitride compound layer using $WF_6$ at a flow rate of 4 sccm and using $NH_3$ at a flow rate of 20 sccm.

* * * * *

UNITED STATES PATENT AND TRADEMARK OFFICE
CERTIFICATE OF CORRECTION

PATENT NO. : 5,970,309

DATED : October 19, 1999

INVENTOR(S) : Jung-min Ha; Byung-Iyul Park, Dae-hong Ko and Sang-in Lee

It is certified that error appears in the above-identified patent and that said Letters Patent is hereby corrected as shown below:

Claim 9, Column 5, should read —Claim 9 The method of claim 6, wherein the dielectric layer comprises one selected from a group consisting of tantalum pentoxide ($Ta_2O_5$), (Ba Sr) $TiO_3$, and Pb(Zr, Ti) $O_3$..--

The other half of Claim 9, Column 5, should read —Claim 22 The method of claim 6, wherein the storage nodes are formed of polysilicon.--

Signed and Sealed this

Thirteenth Day of March, 2001

Attest:

NICHOLAS P. GODICI

*Attesting Officer*  *Acting Director of the United States Patent and Trademark Office*